United States Patent
Umeda

(10) Patent No.: US 9,083,386 B2
(45) Date of Patent: Jul. 14, 2015

(54) ELECTRONIC APPARATUS, RECEIVING APPARATUS, AND ERROR CORRECTION METHOD

(71) Applicant: FUJITSU LIMITED, Kawasaki-shi (JP)

(72) Inventor: Masataka Umeda, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 281 days.

(21) Appl. No.: 13/669,911

(22) Filed: Nov. 6, 2012

(65) Prior Publication Data

US 2013/0219251 A1    Aug. 22, 2013

(30) Foreign Application Priority Data

Feb. 16, 2012  (JP) ................................. 2012-032211

(51) Int. Cl.
  *H03M 13/03* (2006.01)
  *H03M 13/29* (2006.01)
  (Continued)

(52) U.S. Cl.
  CPC ...... *H03M 13/2927* (2013.01); *H03M 13/2936* (2013.01); *H03M 13/2948* (2013.01); *H03M 13/2721* (2013.01); *H03M 13/41* (2013.01)

(58) Field of Classification Search
  CPC . H03M 13/23; H03M 13/27; H03M 13/2957; H03M 13/235; H03M 13/2732; H03M 13/2933; H03M 13/2939; H03M 13/2972; H04L 1/0059; H04L 1/0041; H04L 1/065
  USPC .......... 714/786, 752, 780, 794, 755, 784, 795
  See application file for complete search history.

(56) References Cited

U.S. PATENT DOCUMENTS

| | | | |
|---|---|---|---|
| 6,587,517 B1* | 7/2003 | Li et al. | 375/316 |
| 2003/0005388 A1* | 1/2003 | Fukumasa | 714/786 |

(Continued)

FOREIGN PATENT DOCUMENTS

| | | |
|---|---|---|
| JP | 2005-108332 | 4/2005 |
| JP | 2008-17001 | 1/2008 |

(Continued)

OTHER PUBLICATIONS

Shinichi Murata, et al.; "An Iterative-Decoding Method for Concatenated Error-Correcting Codes on ISDB-T", General Meeting of Institute of Electronics, Information and Communication Engineers, B-5-156, p. 542 (Mar. 18-21, 2008).

(Continued)

*Primary Examiner* — Albert Decady
*Assistant Examiner* — Osman Alshack
(74) *Attorney, Agent, or Firm* — Fujitsu Patent Center

(57) ABSTRACT

In an electronic apparatus, a soft decision likelihood value is generated and subject to a decoding process supporting a convolutional code; and a data series is interleaved, subjected to an error correction process, and decoded data is generated. A detecting unit, based on information concerning the position of a symbol for which an error has been corrected successfully by the error correction process, estimates whether an error occurs in a symbol for which the error correction process failed and detects the position of a symbol estimated to have an error. A setting unit sets based on the decoded data and information concerning the position of the symbol estimated to have an error, a correction value of the soft decision likelihood value. The electronic device interleaves the order of a correction value series of the soft decision likelihood value and feeds the resulting correction value series back to the decoding process.

12 Claims, 14 Drawing Sheets

(51) Int. Cl.
*H03M 13/27* (2006.01)
*H03M 13/41* (2006.01)

(56) References Cited

U.S. PATENT DOCUMENTS

| | | | | |
|---|---|---|---|---|
| 2004/0260997 | A1* | 12/2004 | Kuwahara | 714/755 |
| 2006/0059402 | A1* | 3/2006 | Dominique et al. | 714/755 |
| 2007/0002969 | A1* | 1/2007 | Jeong et al. | 375/298 |
| 2009/0041165 | A1* | 2/2009 | Higashinaka | 375/341 |
| 2009/0046771 | A1* | 2/2009 | Abe et al. | 375/228 |
| 2011/0138258 | A1* | 6/2011 | Okamura et al. | 714/780 |
| 2011/0239095 | A1* | 9/2011 | Tomono et al. | 714/791 |

FOREIGN PATENT DOCUMENTS

| | | |
|---|---|---|
| JP | 2008-263470 | 10/2008 |
| JP | 2011-97355 | 5/2011 |
| JP | 4783337 A | 9/2011 |
| JP | 2011-205511 | 10/2011 |

OTHER PUBLICATIONS

Meritxell Lamarca, et al: "Iterative Decoding Algorithms for RS-Convolutional Concatenated Codes", IEEE International Symposium on Turbo Codes and Related Topics, Brest, France, Sep. 2013, pp. 543-546.

Henna, Tsunenori et al., "Performance improvement by an iterative decoding of Max-Log-MAP-Erasure RS code," The Institute of Electronics, Information and Communication Engineers, IEICE Technical Report RCS2008-149, Nov. 12, 2008, vol. 108, No. 305, pp. 113-118.

Japanese Office Action mailed Apr. 28, 2015 for corresponding Japanese Patent Application No. 2012-032211, with Partial English Translation, 5 pages.

* cited by examiner

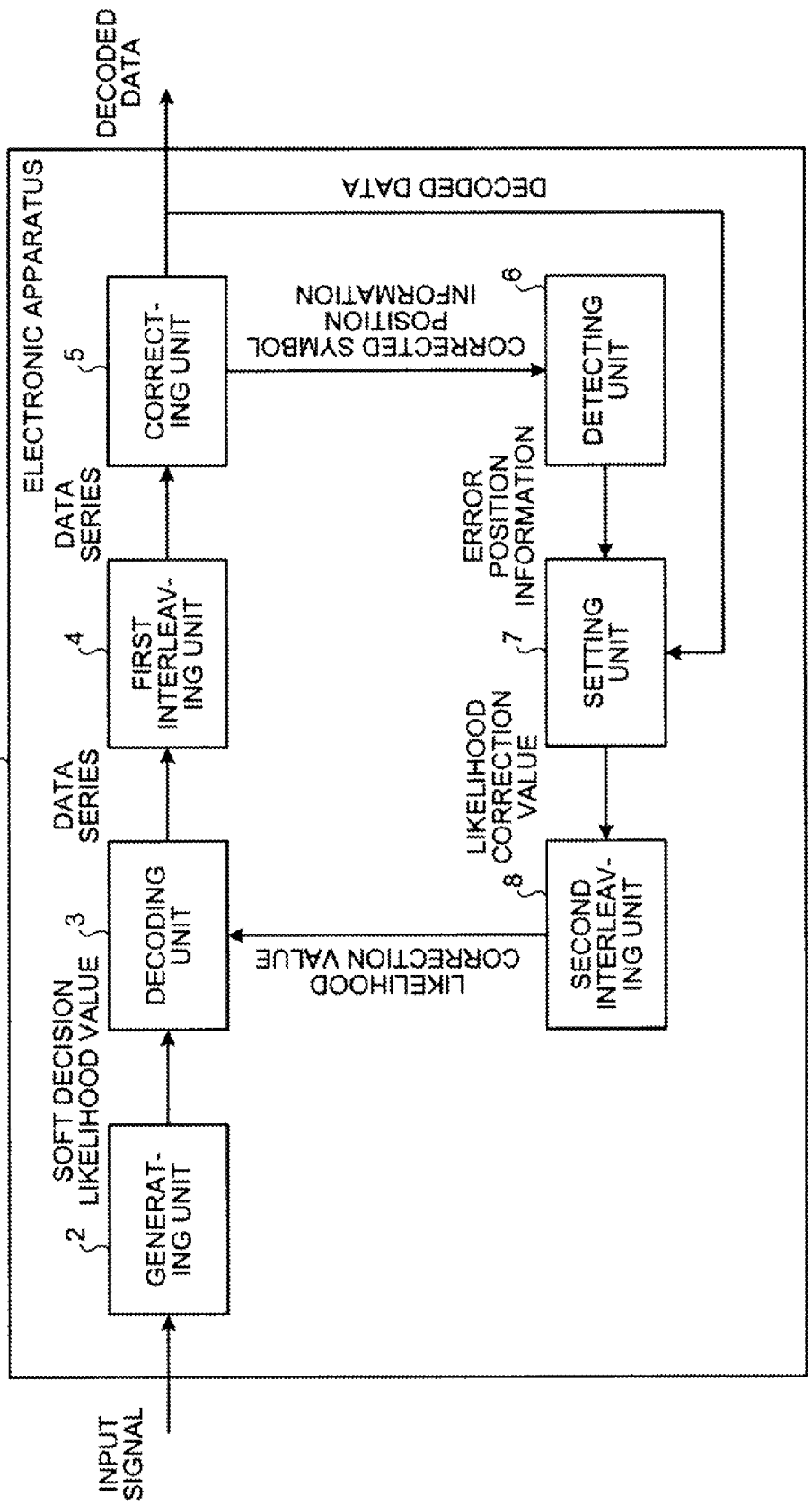

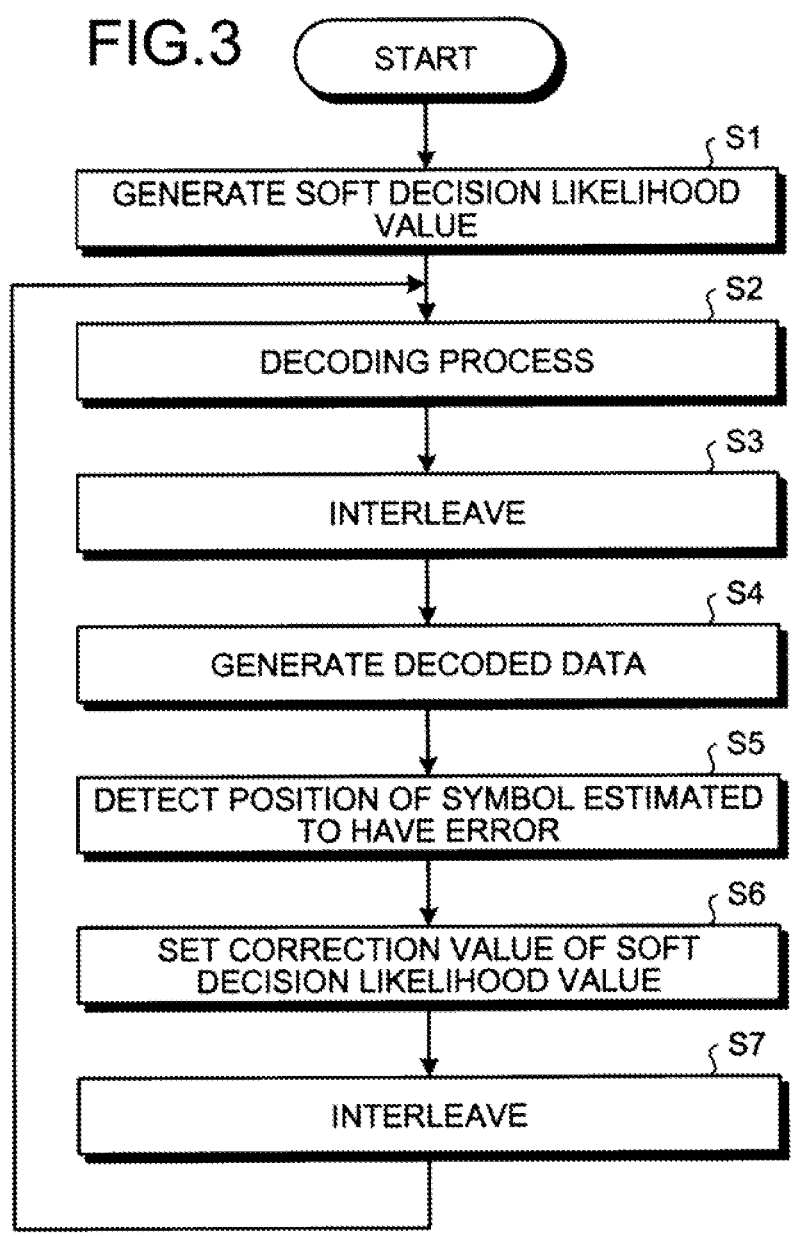

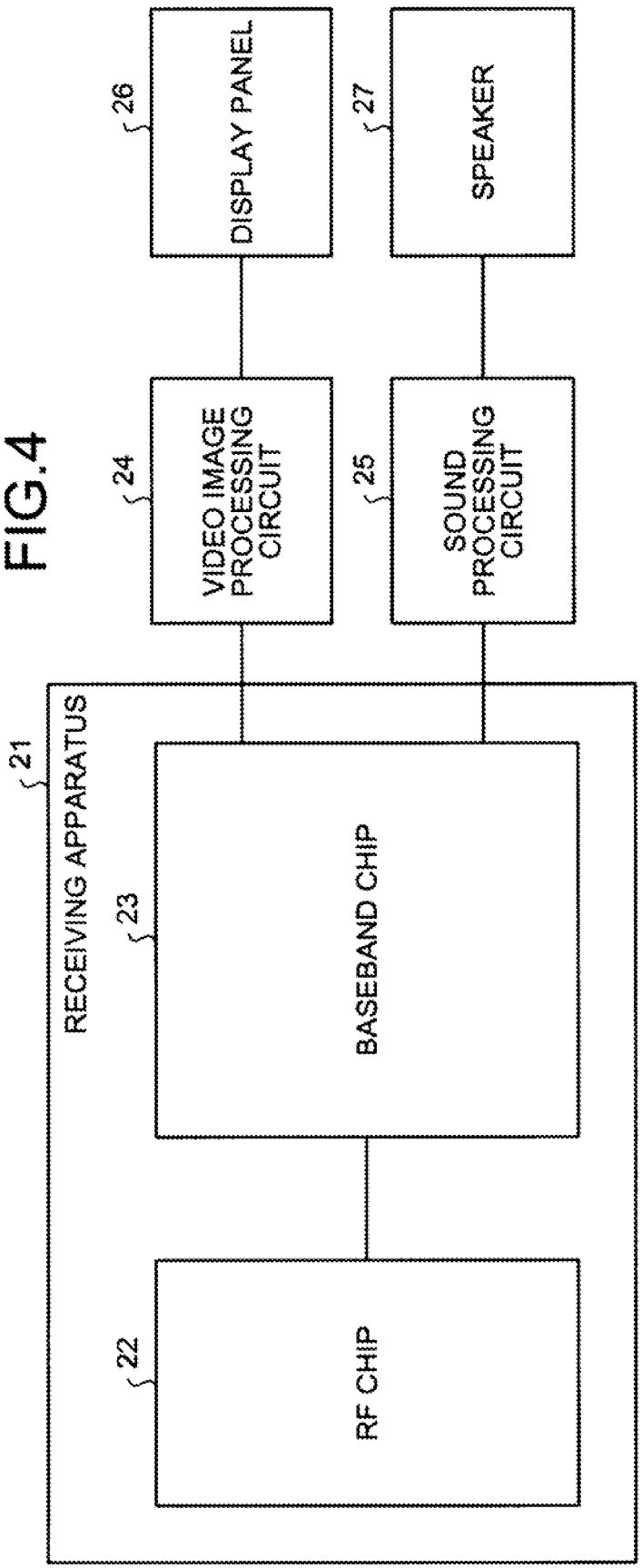

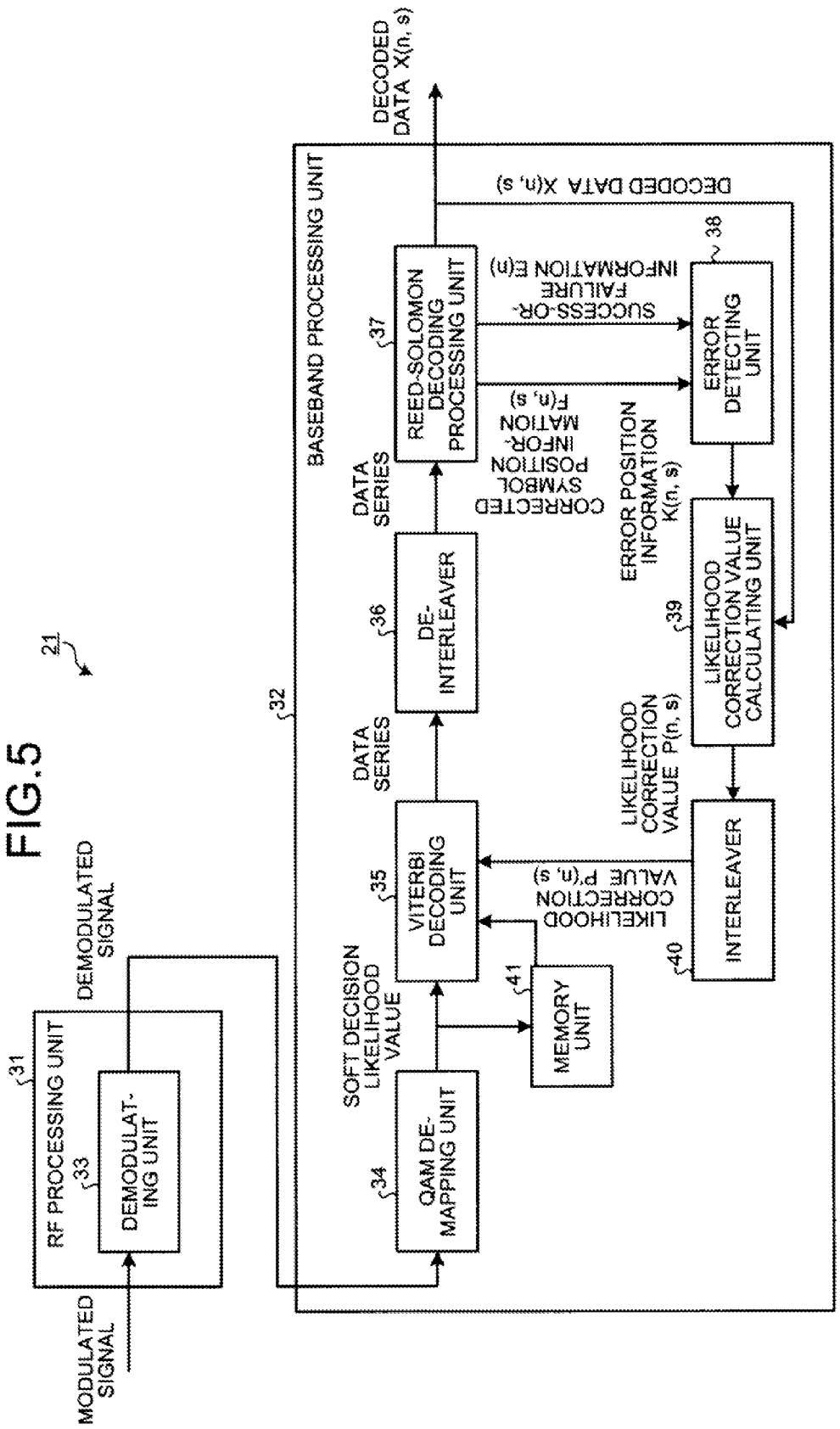

SYMBOL POSITION

| | #1 | #2 | #3 | #4 | #5 | #6 | #7 | #8 | #9 | #10 | #11 | #12 |
|---|---|---|---|---|---|---|---|---|---|---|---|---|
| #1 | | | | | | | | | | | ... | |
| #2 | K | K | K | K | K | K | K | K | K | K | ... | |
| #3 | | | | | | | | | | | ... | |
| #4 | | L | L | L | L | L | L | L | L | L | ... | |
| #5 | | | | | | | | | | | ... | |
| #6 | | | | | | | | | | | ... | |
| #7 | | | M | M | M | M | M | M | M | M | ... | |
| #8 | | | | | N | N | N | N | N | N | ... | |
| #9 | | | | | | | | | | | ... | |
| #10 | | | | | | | | | | | ... | |

OUTPUT PACKET NUMBER

SYMBOL POSITION

| | #1 | #2 | #3 | #4 | #5 | #6 | #7 | #8 | #9 | #10 | #11 | #12 |
|---|---|---|---|---|---|---|---|---|---|---|---|---|
| #1 | | | K | | L | | | M | N | | | ... |
| #2 | | K | | L | | | M | N | | | K | ... |
| #3 | | | | M | N | | | | | K | | ... |
| #4 | | | M | N | | | | | K | | L | ... |
| #5 | | | M | N | | | | K | | L | | ... |
| #6 | | M | | | | | K | | L | | | ... |
| #7 | | | | | | K | | L | | | | ... |
| #8 | | | | | K | | L | | | | N | ... |
| #9 | | | | K | | L | | | M | N | | ... |
| #10 | | | K | | L | | | M | N | | | ... |

OUTPUT PACKET NUMBER

SYMBOL POSITION

|  | #1 | #2 | #3 | #4 | #5 | #6 | #7 | #8 | #9 | #10 | #11 | #12 | ... |  |
|---|---|---|---|---|---|---|---|---|---|---|---|---|---|---|
| #1 | F | F | F | F | F | F | F | F | F | F | F | F | ... | F |
| #2 | F | F | F | F | F | F | F | F | F | F | F | F | ... | F |
| #3 |   |   |   |   | C | C |   |   |   | C |   |   | ... |   |
| #4 | F | F | F | F | F | F | F | F | F | F | F | F | ... | F |
| #5 | F | F | F | F | F | F | F | F | F | F | F | F | ... | F |
| #6 |   |   | C |   |   |   | C |   | C |   |   |   | ... |   |
| #7 |   |   |   |   |   |   | C |   | C |   |   |   | ... |   |
| #8 |   |   |   |   |   | C |   | C |   |   | C |   | ... |   |
| #9 | F | F | F | F | F | F | F | F | F | F | F | F | ... | F |
| #10 | F | F | F | F | F | F | F | F | F | F | F | F | ... | F |

OUTPUT PACKET NUMBER

SYMBOL POSITION

|  | #1 | #2 | #3 | #4 | #5 | #6 | #7 | #8 | #9 | #10 | #11 | #12 | ... |  |
|---|---|---|---|---|---|---|---|---|---|---|---|---|---|---|
| #1 | R | R | R | R | R | R | E | E | R | R |   |   | ... | R |
| #2 | R | R | R | R | R | E | E |   | R | R | E |   | ... | R |
| #3 |   |   |   |   | E | E |   |   |   | E |   |   | ... |   |
| #4 | R | R | R | R | E | R | R | R | E | R | E |   | ... | R |
| #5 | R | R | R | E | R | R | R | E | R | R |   |   | ... | R |
| #6 |   |   | C |   |   |   | E |   | E |   |   |   | ... |   |
| #7 |   |   |   |   | E |   | E |   |   |   |   |   | ... |   |
| #8 |   |   |   |   | E |   | E |   |   | C |   |   | ... |   |
| #9 | R | R | R | E | R | E | R | R | E | R |   |   | ... | R |
| #10 | R | R | E | R | E | R | R | E | R | R |   |   | ... | R |

OUTPUT PACKET NUMBER

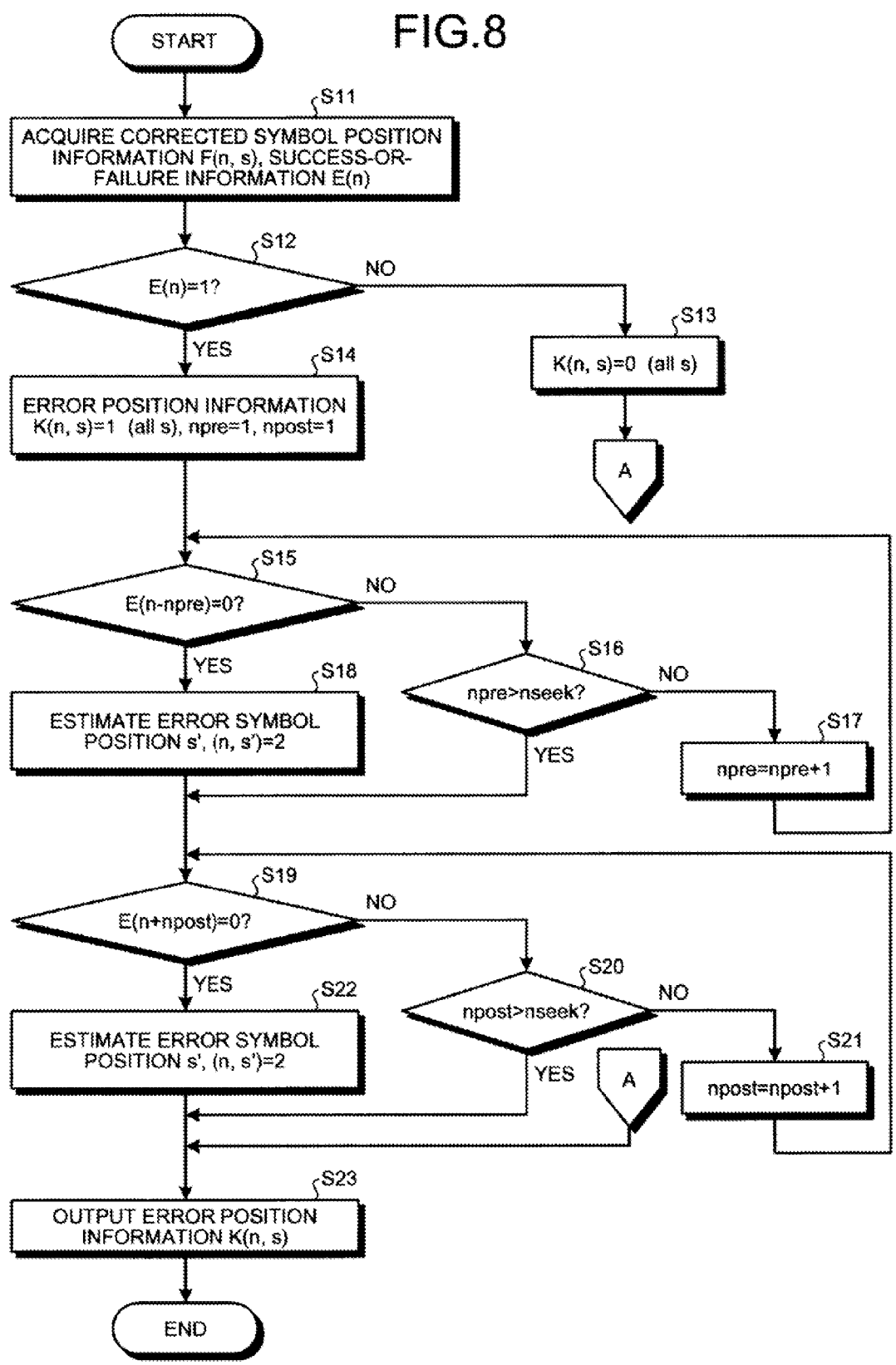

FIG.10 TYPICAL URBAN 6-WAVE MODEL

| PATH NO. | DELAY (μs) | POWER (dB) |
| --- | --- | --- |
| 1 | 0 | -3 |
| 2 | 0.2 | 0 |
| 3 | 0.5 | -2 |
| 4 | 1.6 | -6 |
| 5 | 2.3 | -8 |
| 6 | 5 | -10 |

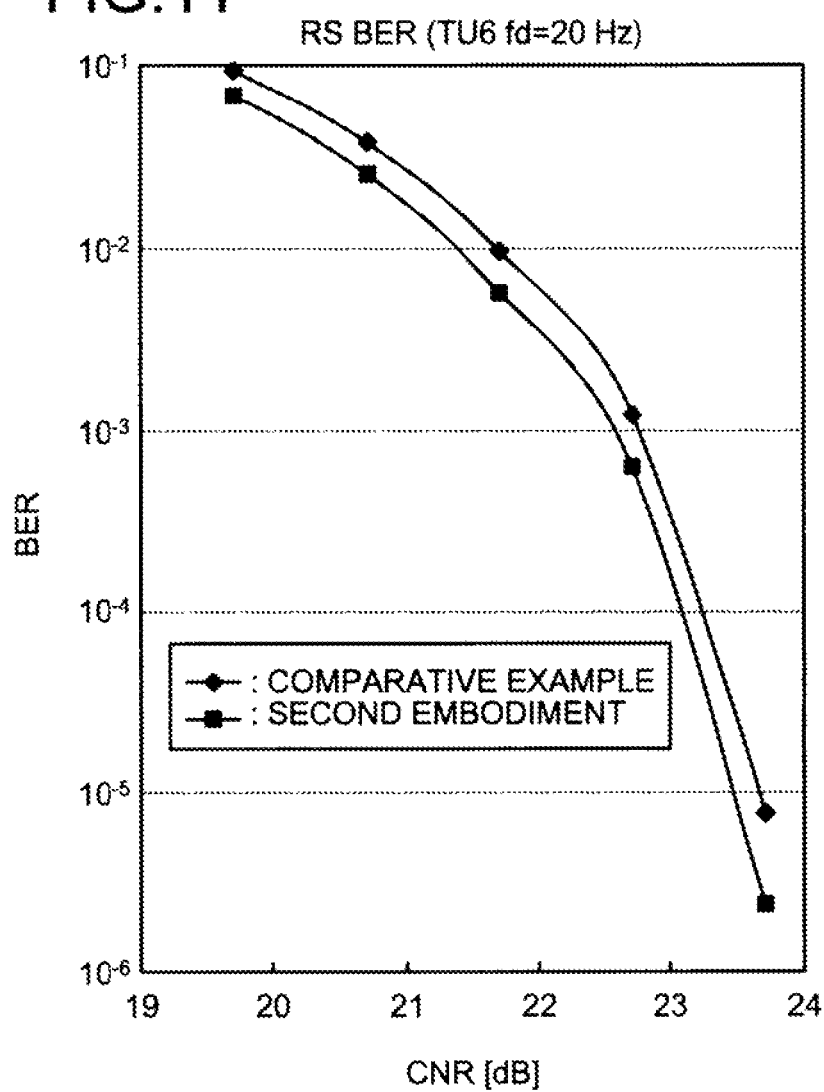

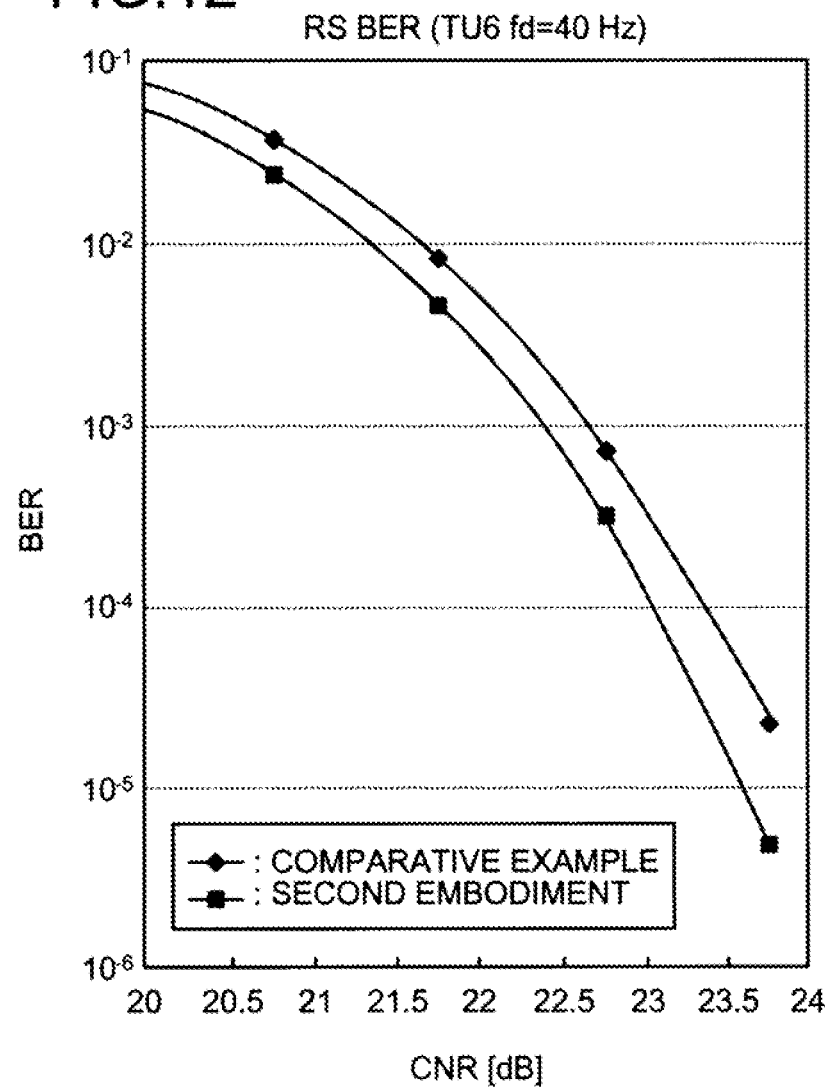

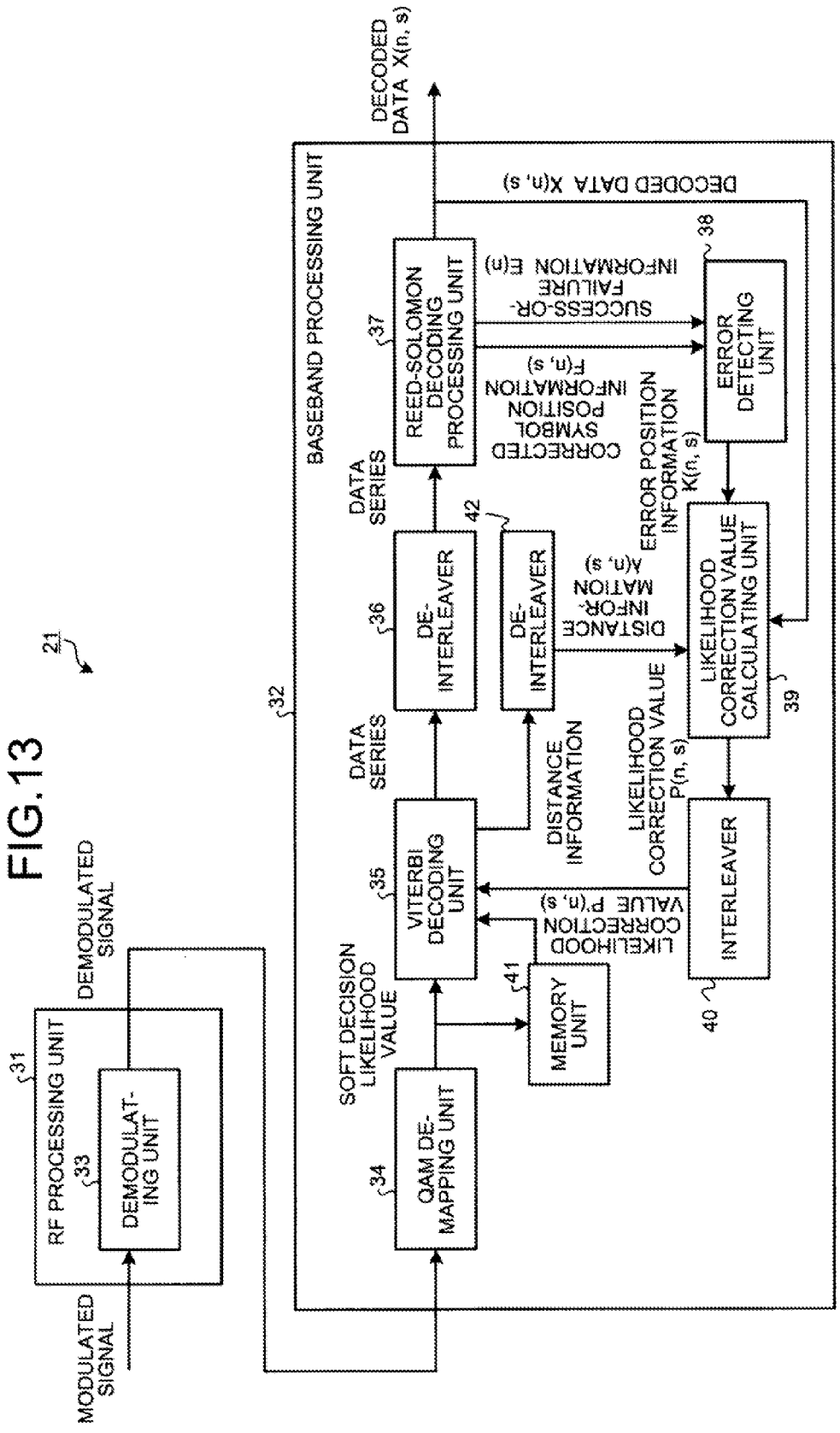

ELECTRONIC APPARATUS, RECEIVING APPARATUS, AND ERROR CORRECTION METHOD

CROSS REFERENCE TO RELATED APPLICATIONS

This application is based upon and claims the benefit of priority of the prior Japanese Patent Application No. 2012-032211, filed on Feb. 16, 2012, the entire contents of which are incorporated herein by reference.

FIELD

The embodiments discussed herein are related to an electronic apparatus, a receiving apparatus, and an error correction method.

BACKGROUND

Concatenated channel encoding that uses, for example, Reed-Solomon code as external code and, for example, convolutional code as internal code, is conventionally applied as an error correction encoding process for the digital terrestrial broadcasting. A receiving apparatus thereof executes an error correction process that combines, for example, Viterbi decoding and Reed-Solomon decoding. An iterative decoding approach is proposed that improves the error correction capacity by repeating the error correction process executed by the receiving apparatus multiple times (see, e.g., Japanese Laid-Open Patent Publication No. 2011-205511; Lamarca, Meritxell, et al, "Iterative Decoding Algorithms for RS-Convolutional Concatenated Codes", Proc. of 3rd intl. Symposium on Turbo Codes and Related Topics (2003); and Murata, Shinichi, et al, "An Iterative-Decoding Method for Concatenated Error-Correcting Codes on ISDB-T", General Meeting of Institute of Electronics, Information and Communication Engineers, B-5-156, March 2008).

According to the technique disclosed in the literature of Lamarca, M., et al a soft decision output scheme such as soft output Viterbi algorithm (SOVA) decoding or Max-log-MAP decoding is used for a decoding process supporting the convolutional code. Similarly, the soft decision output scheme is employed in the Reed-Solomon decoding. On the other hand, according to the technique disclosed in the literature of Murata, S., et al, a feedback value from a Reed-Solomon decoding process to a decoding process supporting the convolutional code is generated depending on the success or failure of the error correction, for each transport stream packet (TSP) that is the processing unit of the Reed-Solomon code.

A method is present according to which a penalty is set depending on the success or failure of the error correction in a Reed-Solomon decoding process and the penalty is fed back to a decoding process supporting the convolutional code. According to this method, a heavy penalty is imposed on the decoding process supporting the convolutional code, when the result of the decoding process does not match the decoded data acquired after the error correction for the TSP for which error correction has been successfully executed (see, e.g., Japanese Laid-Open Patent Publication No. 2011-205511).

However, according to the conventional method of imposing a penalty on the decoding process supporting the convolutional code, reliability can not be determined for the result of the decoding process supporting the convolutional code for a TSP for which error correction has failed. Therefore, a penalty that reflects the reliability of the result of the decoding process cannot be imposed on the decoding process supporting the convolutional code. Therefore, when errors occur in bursts in the decoding process supporting the convolutional code, the error correction fails in the Reed-Solomon decoding process. Therefore, a problem arises in that the correction capacity of the decoding process supporting the convolutional code is degraded.

SUMMARY

According to an aspect of an embodiment, an electronic apparatus includes a generating unit that generates a soft decision likelihood value based on an input signal; a decoding unit that with respect to the soft decision likelihood value, executes a decoding process supporting a convolutional code; a first interleaving unit that interleaves the order of a data series acquired by the decoding process; a correcting unit that generates decoded data corresponding to the input signal by executing an error correcting process on the data series that has been interleaved by the first interleaving unit; a detecting unit that based on position information of a symbol for which error has been corrected successfully by the error correcting process, estimates whether an error occurs with respect to a symbol for which error cannot be corrected due to a failure of the error correcting process and detects a position of the symbol that is estimated to have an error; a setting unit that based on the decoded data and information concerning the position of the symbol estimated to have an error, sets a correction value of the soft decision likelihood value; and a second interleaving unit that interleaves the order of a correction value series of the soft decision likelihood value into an order that is a reverse of the order resulting from interleaving by the first interleaving unit. The correction value series of the soft decision likelihood value resulting from interleaving by the second interleaving unit is fed back to the decoding unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a block diagram of signal and data flow in the electronic apparatus;

FIG. 3 is a flowchart of decoding and error correction processes in the electronic apparatus;

FIG. 4 is a block diagram of a receiving apparatus according to a second embodiment;

FIG. 5 is a block diagram of signal and data flow in the receiving apparatus;

FIGS. 6A and 6B are explanatory schematic diagrams of the operation of a de-interleaver of the receiving apparatus;

FIGS. 7A and 7B are explanatory schematic diagrams of the operation of an error detecting unit in the receiving apparatus;

FIG. 8 is a flowchart of the operation of the error detecting unit in the receiving apparatus;

FIG. 10 is a chart of an example of simulation conditions for the receiving apparatus;

FIGS. 11 and 12 are graphs depicting characteristics of an example of the simulation results for the receiving apparatus;

FIG. 13 is a block diagram of signal and data flow in the receiving apparatus according to a third embodiment;

DESCRIPTION OF EMBODIMENTS

Figure 1:
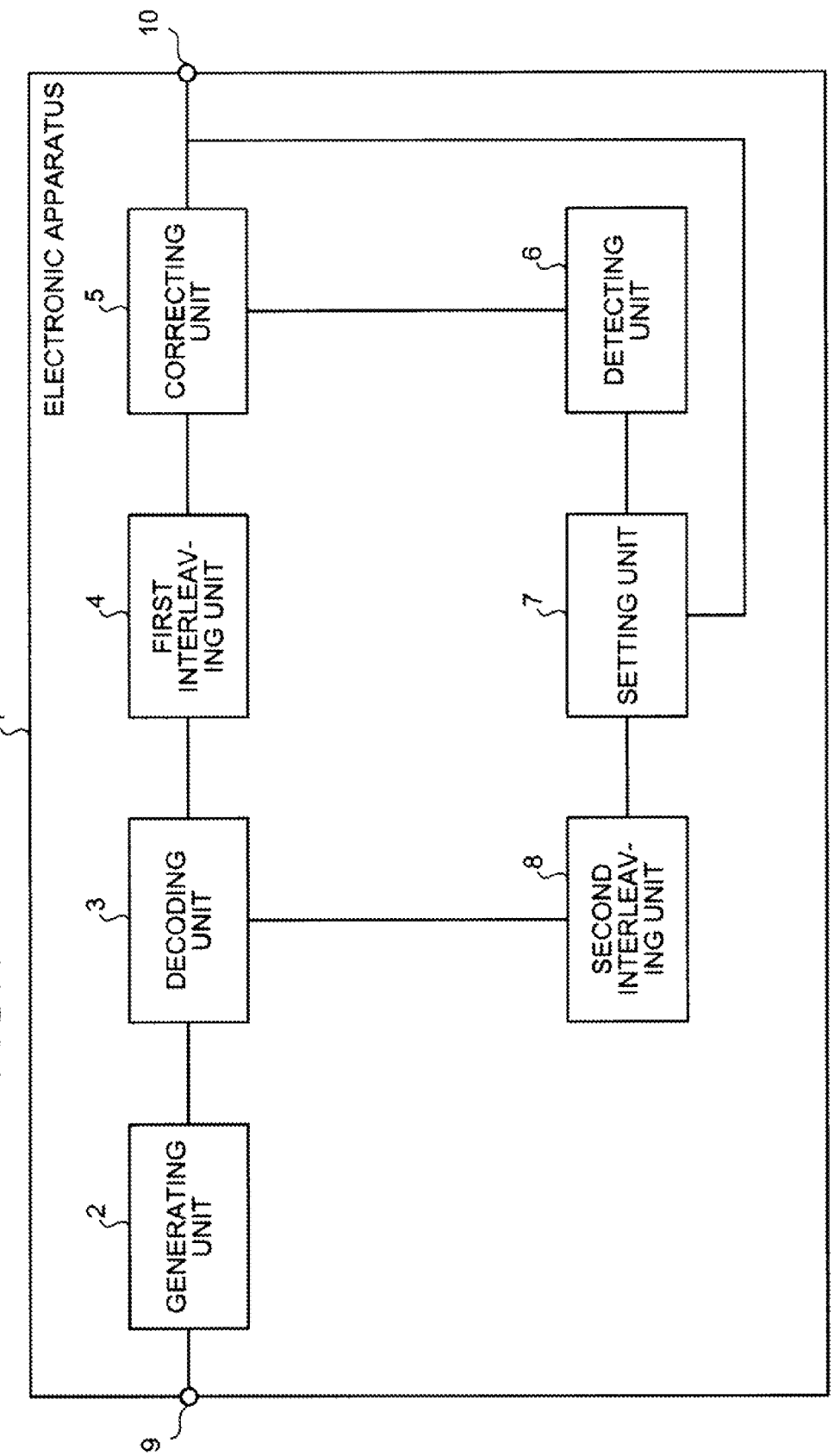
FIG. 1 is a block diagram of an electronic apparatus according to a first embodiment.

Preferred embodiments of an electronic apparatus, a receiving apparatus, and an error correction method will be described with reference to the accompanying drawings. In the description of the embodiments below, identical constituent elements are given the same reference numerals and redundant explanation is omitted.

FIG. 1 is a block diagram of an electronic apparatus according to a first embodiment. FIG. 2 is a block diagram of signal and data flow in the electronic apparatus according to the first embodiment. As depicted in FIGS. 1 and 2, the electronic apparatus 1 includes a generating unit 2, a decoding unit 3, a first interleaving unit 4, a correcting unit 5, a detecting unit 6, a setting unit 7, and a second interleaving unit 8.

The generating unit 2 is connected to an input terminal 9 of the electronic apparatus 1. The generating unit 2 generates a soft decision likelihood value based on a signal input from the input terminal 9.

The decoding unit 3 is connected to the generating unit 2. The decoding unit 3 executes with respect to the soft decision likelihood value output from the generating unit 2, a decoding process supporting convolutional code that has been encoded by an apparatus (not depicted) on the transmission side.

The first interleaving unit 4 is connected to the decoding unit 3. The first interleaving unit 4 interleaves the order of a data series acquired by the decoding process executed by the decoding unit 3. The direction of this interleaving may be the reverse direction of the interleaving executed by an apparatus on the transmission side with respect to the data series in the transmission data, i.e., a direction cancelling the interleaving by the apparatus on the transmission side.

The correcting unit 5 is connected to the first interleaving unit 4 and an output terminal 10 of the electronic apparatus 1. The correcting unit 5 executes an error correction process on the interleaved data series output from the first interleaving unit 4, and generates decoded data that corresponds to the signal input into the electronic apparatus 1. The electronic apparatus 1 outputs from the output terminal 10, the decoded data output from the correcting unit 5.

The detecting unit 6 is connected to the correcting unit 5. The detecting unit 6 estimates whether error occurs with respect to a symbol for which error cannot be corrected due to a failure of the error correction process, based on information concerning the position of a symbol for which error has corrected successfully by the error correction process executed by the correcting unit 5. Hereinafter, the information concerning the position of the symbol for which error has been corrected by the correcting unit 5 will be referred to as "corrected symbol position information". The detecting unit 6 detects the position of the symbol that is estimated to have an error.

The setting unit 7 is connected to the correcting unit 5 and the detecting unit 6. The setting unit 7 sets a correction value of the soft decision likelihood value, based on the decoded data output from the correcting unit 5 and the information concerning the position of the symbol that is estimated to have an error. Hereinafter, information concerning the position of the symbol for which error has been corrected and concerning the position of the symbol that is estimated to have an error will be referred to as "error position information", and the correction value of the soft decision likelihood value will be referred to as "likelihood correction value".

The second interleaving unit 8 is connected to the setting unit 7 and the decoding unit 3. The second interleaving unit 8 interleaves the order of a likelihood correction value series into an order that is the reverse direction of the interleaving executed by the first interleaving unit 4. Therefore, the order of the likelihood correction value series resulting from the interleaving executed by the second interleaving unit 8 is identical to the order of the soft decision likelihood value series input into the decoding unit 3 by the generating unit 2.

The electronic apparatus 1 feeds back to the decoding unit 3, the likelihood correction value series resulting from the interleaving executed by the second interleaving unit 8. The electronic apparatus 1 corrects the soft decision likelihood value using the likelihood correction values fed back to the decoding unit 3 and executes iterative decoding processes.

FIG. 3 is a flowchart of the decoding and the error correction processes in the electronic apparatus according to the first embodiment. As depicted in FIG. 3, when the decoding and the error correction processes are started in the electronic apparatus 1, the generating unit 2 first generates the soft decision likelihood value based on the input signal (step S1).

The decoding unit 3 executes with respect to the soft decision likelihood value output from the generating unit 2, the decoding process supporting the convolutional code (step S2). The first interleaving unit 4 interleaves the order of the data series output from the decoding unit 3 (step S3).

The correcting unit 5 generates decoded data that corresponds to the input signal by executing the error correction process on the data series that has been interleaved and output by the first interleaving unit 4 (step S4). The detecting unit 6, based on the corrected symbol position information supplied from the correcting unit 5, estimates whether an error occurs with respect to a symbol for which error cannot be corrected due to the failure of the error correction process executed by the correcting unit 5. The detecting unit 6 detects the position of the symbol that is estimated to have an error (step S5).

The setting unit 7 sets the correction value of the soft decision likelihood value, i.e., the likelihood correction value, based on the decoded data supplied from the correcting unit 5 and the error position information supplied from the detecting unit 6 (step S6). The second interleaving unit 8 interleaves the order of the likelihood correction value series output from the setting unit 7, into an order that is a reverse of the order resulting from the interleaving executed by the first interleaving unit 4 (step S7).

The procedure returns to step S2, the electronic apparatus 1 feeds back to the decoding unit 3, the likelihood correction value series resulting from the interleaving executed by the second interleaving unit 8. The electronic apparatus 1 executes the iterative decoding processes by repeating steps S2 to S7 for the soft decision likelihood value output from the generating unit 2 reflecting the likelihood correction value supplied from the second interleaving unit 8.

According to the first embodiment, the order of the data series acquired in the decoding process executed by the decoding unit 3 is interleaved by the first interleaving unit 4, whereby errors occurring in bursts in the decoding process executed by the decoding unit 3 can be converted into random errors. The position of a symbol having an error is estimated from the symbols for which correction processes executed by the correcting unit 5 have failed, based on the positions of symbols for which the correction process has been executed successfully by the correcting unit 5, whereby the position of a symbol having no error can be estimated. The likelihood correction value is acquired based on the position of the symbol for which a correct solution has been acquired in the decoding process executed by the decoding unit 3 and the position of the symbol that is estimated to have no error. Consequently, more information concerning the symbols can be reflected on the likelihood correction value. Therefore, the error correction capacity of the electronic apparatus 1 can be improved.

A second embodiment is an example where the electronic apparatus 1 according to the first embodiment is applied to a receiving apparatus for digital terrestrial broadcasting. In addition to the receiving apparatus for the digital terrestrial broadcasting, the electronic apparatus 1 is applicable to an apparatus that receives a signal concatenated-channel-coded by an apparatus on the transmission side and that decodes the signal using the iterative decoding processes.

FIG. 4 is a block diagram of the receiving apparatus according to the second embodiment. As depicted in FIG. 4, the receiving apparatus 21 includes, for example, a radio frequency (RF) chip 22 and a baseband chip 23.

The RF chip 22 is connected to an antenna (not depicted). The RF chip 22 processes a high-frequency signal received through the antenna. The baseband chip 23 is connected to the RF chip 22. The baseband chip 23 processes a baseband signal output from the RF chip 22.

The baseband chip 23 is connected to a video image processing circuit 24 and a sound processing circuit 25. The video image processing circuit 24 processes a video image signal output from the baseband chip 23 and displays an image on a display panel 26 that is connected to the video image processing circuit 24. The sound processing circuit 25 processes a sound signal output from the baseband chip 23 and outputs a sound from a speaker 27 that is connected to the sound processing circuit 25.

A typical digital terrestrial broadcasting television receiver includes the receiving apparatus 21, the video image processing circuit 24, the sound processing circuit 25, the display panel 26, and the speaker 27. A typical digital terrestrial broadcast tuner apparatus does not include the display panel 26 and the speaker 27 but includes the receiving apparatus 21, the video image processing circuit 24, and the sound processing circuit 25.

FIG. 5 is a block diagram of signal and data flow in the receiving apparatus according to the second embodiment. As depicted in FIG. 5, the receiving apparatus 21 includes an RF processing unit 31 and as an example of the electronic apparatus, a baseband processing unit 32.

The RF processing unit 31 processes a high-frequency signal. The RF processing unit 31 is implemented by a circuit of the RF chip 22 and includes a demodulating unit 33. The demodulating unit 33 demodulates a high-frequency modulated signal and thereby, generates a baseband demodulated signal.

The baseband processing unit 32 decodes the baseband demodulated signal generated by the demodulating unit 33 and thereby, generates decoded data. The baseband processing unit 32 may be implemented by a circuit of the baseband chip 23 or may be implemented by execution of software to process the baseband signal in the baseband chip 23. The baseband processing unit 32 includes, for example, a quadrature amplitude modulation (QAM) de-mapping unit 34 as the generating unit; a Viterbi decoding unit 35 as the decoding unit; a de-interleaver 36 as the first interleaving unit; and a Reed-Solomon decoding processing unit 37 as the correcting unit.

The baseband processing unit 32 includes, for example, an error detecting unit 38 as the detecting unit; a likelihood correction value calculating unit 39 as the setting unit; and an interleaver 40 as the second interleaving unit. The baseband processing unit 32 includes a memory unit 41.

The QAM de-mapping unit 34 executes a symbol mapping process for the demodulated signal output from the demodulating unit 33 and thereby, generates a soft decision likelihood value for the data. The generated soft decision likelihood value is delivered to the Viterbi decoding unit 35 and the memory unit 41. The soft decision likelihood value stored in the memory unit 41 is supplied to the Viterbi decoding unit 35 and is used in a second and subsequent iterative Viterbi decoding process executed by the Viterbi decoding unit 35.

The Viterbi decoding unit 35 executes a Viterbi decoding process supporting the convolutional code generated by a convolution encoding process executed by the apparatus on the transmission side. In the Viterbi decoding process, the soft decision likelihood value input into the Viterbi decoding unit 35 and an output value estimated from a state transition series used in the convolution encoding are compared with each other, whereby the most probable data is estimated. In the second and subsequent iterative Viterbi decoding processes, the Viterbi decoding unit 35 executes the Viterbi decoding processes using the likelihood correction value P'(n, s) fed back from the interleaver 40 and the soft decision likelihood value delayed by the memory unit 41.

The de-interleaver 36 de-interleaves the data series output from the Viterbi decoding unit 35 such that the errors occurring in bursts in the data series are spread over multiple TSPs and thereby, changed to random errors. An example of the de-interleaving method is depicted in FIGS. 6A and 6B.

FIGS. 6A and 6B are explanatory schematic diagrams of the operation of the de-interleaver of the receiving apparatus according to the second embodiment. In FIGS. 6A and 6B, reference numerals "51" and "52" denote matrices acquired before and after the de-interleaving and presenting relations between the TSPs and symbols.

For example, a group of symbols in one lateral row such as "K" symbols included in TSP #2 of the matrix 51 acquired before the de-interleaving may be de-interleaved into an oblique direction from the upper right to lower left, spreading over multiple TSPs in the matrix 52 acquired after the de-interleaving. In this case, assuming that the "K" symbols are symbols each having errors occurring in bursts in the TSP #2 occur when the symbols are output from the Viterbi decoding unit 35. The de-interleaving process converts the errors occurring in bursts in the TSP #2 into random errors.

For example, it is assumed that up to three symbols can be corrected in the decoding and the correction processes executed by the Reed-Solomon decoding processing unit 37. In this case, each of the TSPs includes only one or two of the "K" symbols in the matrix 52 acquired after the de-interleaving and therefore, the Reed-Solomon decoding process can correct the errors in all the TSPs.

On the other hand, assuming that each of the "K", "L", "M", and "N" symbols has an error, for a TSP whose number of symbols having an error exceeds the correction capacity in the matrix 52 (acquired after the de-interleaving), detection of the position and the correction process can not be executed for all the symbols having an error. In the example of the matrix 52 acquired after the de-interleaving, the TSPs #1, #2, #4, #5, #9, and #10 correspond to such TSPs.

The Reed-Solomon decoding processing unit 37 executes the Reed-Solomon decoding process for each TSP of the data series output from the de-interleaver 36 and thereby, generates decoded data X(n, s), success-or-failure information E(n), and the corrected symbol position information F(n, s). "n" represents the packet number of a TSP and "s" represents the position of a symbol. "n" and "s" are natural numbers. The Reed-Solomon decoding process may be a soft decision process or may be a hard decision process. The decoded data X(n, s) generated is output from the baseband processing unit 32 to, for example, the video image processing circuit 24 and the sound processing circuit 25 (see FIG. 4).

The success-or-failure information E(n) indicates for each of the TSPs of the decoded data X(n, s) generated in the Reed-Solomon decoding process, whether the error correction has been successfully executed or has failed in the Reed-Solomon decoding process. For example, in the Reed-Solomon decoding process, a value of E(n) for successfully executed error correction may be "0" and that for failed error correction may be "1".

The corrected symbol position information F(n, s) indicates the position of the symbol for which error correction is executed in the Reed-Solomon decoding process. For example, in the Reed-Solomon decoding process, the value of F(n, s) of the symbol for which error correction is not executed may be "0" and that of the symbol F(n, s) for which error correction is executed may be "1".

The error detecting unit 38 detects in the TSP for which error correction has failed in the Reed-Solomon decoding process and based on the success-or-failure information E(n) and the corrected symbol position information F(n, s), the position of a symbol that is estimated to have an error. An example of a method of estimating a symbol having an error occurring is depicted in FIGS. 7A and 7B.

FIGS. 7A and 7B are explanatory schematic diagrams of the operation of the error detecting unit in the receiving apparatus according to the second embodiment. In FIGS. 7A and 7B, reference numerals "53" and "54" denote matrices acquired after the Reed-Solomon decoding process and after detecting the positions of the symbols that are estimated to have an error, and presenting relations between the TSPs and the symbols.

In FIGS. 7A and 7B, "C" represents a symbol for which error correction has been successfully executed in the Reed-Solomon decoding process; "F" represents a symbol for which error correction has failed in the Reed-Solomon decoding process; "R" represents a symbol that is estimated to be a correct solution by the error detecting unit 38, among the symbols for which error correction has failed in the Reed-Solomon decoding process; "E" represents a symbol that is estimated, by the error detecting unit 38, to have an error, among the symbols for which error correction has failed in the Reed-Solomon decoding process; and "N" represents a symbol for which estimation by the error detecting unit 38 has failed, among the symbols for which error correction has failed in the Reed-Solomon decoding process. No alphabet character is indicated for a symbol for which a correct solution has been acquired in the Viterbi decoding process.

The matrix 53 acquired after the Reed-Solomon decoding process corresponds to the matrix 52 acquired after the de-interleaving of FIGS. 6A and 6B. The TSPs #1, #2, #4, #5, #9, and #10 each exceed the correction capacity of the Reed-Solomon decoding process and therefore, in the matrix 53 acquired after the Reed-Solomon decoding process, all the symbols of the corresponding TSPs are each denoted by "F".

The error detecting unit 38 estimates that errors occur with respect to the symbols arranged in the order according to the interleaving direction of the de-interleaver 36, based on the symbols for which errors are corrected in the Reed-Solomon decoding process. In the example depicted, with respect to the "C" symbols, it is estimated that errors occur with respect to the symbols arranged in the oblique direction indicated by arrows, as indicated in the matrix 54 acquired after the detection of the positions of symbols that are estimated to have errors.

The error detecting unit 38 records, as error position information K(n, s), the position of a symbol that is estimated to have an error, among the symbols for which error correction has failed in the Reed-Solomon decoding process. The error detecting unit 38 may record, as error position information K(n, s), the position of a symbol that is estimated to be a correct solution, among the symbols for which error correction has failed in the Reed-Solomon decoding process, and a TSP for which error correction has been successfully executed in the Reed-Solomon decoding process.

For example, in the TSP for which error correction has failed in the Reed-Solomon decoding process, the value of K(n, s) of a symbol that is estimated to have an error may be "2", and the value of K(n, s) of a symbol that is estimated to be a correct solution may be "1". For example, the value of K(n, s) of a symbol of a TSP for which error correction has been successfully executed in the Reed-Solomon decoding process may be "0".

The likelihood correction value calculating unit 39 receives the error position information K(n, s) from the error detecting unit 38 and receives the decoded data X(n, s) from the Reed-Solomon decoding processing unit 37. The likelihood correction value calculating unit 39 sets a likelihood correction value P(n, s) for each of the symbols of the TSPs for which error correction has been successfully executed in the Reed-Solomon decoding process and for each of the symbols that are estimated to be correct solutions of the TSPs for which error correction has failed in the Reed-Solomon decoding process, based on the error position information K(n, s) and the decoded data X(n, s).

For example, the likelihood correction value P(n, s) may be set by calculating Eq. (1) below, for symbols of a TSP for which error correction has been successfully executed in the Reed-Solomon decoding process, i.e., the symbols whose value of K(n, s) is "0". "W1" is a weighting factor.

$$P(n,s)=X(n,s)\times W1 (\text{when, } K(n,s)=0) \quad (1)$$

For example, the likelihood correction value P(n, s) may be set by calculating Eq. (2) below, for symbols that are estimated to be the correct solution and are of a TSP for which error correction has failed in the Reed-Solomon decoding process, i.e., the symbol whose value of K(n, s) is "1". "W2" is a weighting factor. The value of W2 may be set to be smaller than that of W1 taking into consideration the possibility that the error detecting unit 38 estimates a symbol actually having an error to be the correct solution.

$$P(n,s)=X(n,s)\times W2(\text{when, } K(n,s)=1) \quad (2)$$

For example, the likelihood correction value P(n, s) may be set according to Eq. (3) below, for symbols that are estimated to have an error and are of a TSP for which error correction has failed in the Reed-Solomon decoding process, i.e., the symbols whose value of K(n, s) is "2".

$$P(n,s)=\text{NULL}(\text{when, } K(n,s)=2) \quad (3)$$

The interleaver 40 interleaves the series of the likelihood correction values P(n, s) output from the likelihood correction value calculating unit 39 such that the order thereof is same as that of the series of soft decision likelihood values and inputs the resulting series of likelihood correction values P'(n, s) into the Viterbi decoding unit 35. The likelihood correction values P'(n, s) whose order has been interleaved by the interleaver 40 are fed back to the Viterbi decoding unit 35 and are used in the second and subsequent iterative Viterbi decoding processes executed by the Viterbi decoding unit 35.

When the process of generating the decoded data from the received modulated signal is started, in the receiving apparatus according to the second embodiment, the demodulating unit 33 first demodulates the modulated signal and thereby, generates a demodulated signal. The steps up to the generation of the decoded data from the demodulated signal are same as steps S1 to S7 of "the decoding and the error correction processes" described with reference to FIG. 3 in the first embodiment. However, the soft decision likelihood values are supplied from the memory unit 41 in the second and subsequent iterative decoding processes executed by the Viterbi decoding unit 35.

FIG. 8 is a flowchart of the operation of the error detecting unit in the receiving apparatus according to the second embodiment. As depicted in FIG. 8, the error detecting unit 38 first acquires the corrected symbol position information F(n, s) and the success-or-failure information E(n) from the Reed-Solomon decoding processing unit 37 (step S11).

If the value of the success-or-failure information E(n) of the current TSP #n is not "1" (step S12: NO), the error detecting unit 38 sets the value of the error position information K(n, s) for all the symbols of the current TSP #n to be "0" (step S13). Through step S13, the value of the error position information K(n, s) for all the symbols of the TSPs for which error correction has been successfully executed in the Reed-Solomon decoding process is set to be "0".

On the other hand, if the value of the success-or-failure information E(n) of the current TSP #n is "1" (step S12: YES), the error detecting unit 38 initializes the values of the error position information K(n, s) and variables "npre" and "npost". Through this initialization, the value of the error position information K(n, s) of all the symbols of the current TSP #n and the variables npre and npost are set to be "1" (step S14).

The error detecting unit 38 determines whether the value of the success-or-failure information E(n−npre) of the TSP #(n−npre) before the current TSP #n is "0" (step S15). If the error detecting unit 38 determines that the value is not "0" (step S15: NO), the error detecting unit 38 increments the value of npre (step S17) provided that the value of npre does not exceed the value of nseek (step S16: NO).

"nseek" is a value to determine a search range for searching for a TSP for which error correction has been successfully executed in the Reed-Solomon decoding process, relative to the current TSP #n. For example, when the value of nseek is "3", the error detecting unit 38 searches for a TSP for which error correction has been successfully executed in a range, for example, from the TSP #2 to the TSP #4 relative to the current TSP #5.

The error detecting unit 38 newly determines whether the value of the success-or-failure information E(n−npre) is "0" (step S15). If the error detecting unit 38 determines that the value of the success-or-failure information E(n−npre) is "0" (step S15: YES), this indicates that a TSP has been found for which error correction has been successfully executed in the Reed-Solomon decoding process before the current TSP #n. Therefore, the error detecting unit 38 estimates the position s' of a symbol having an error in the current TSP #n based on the corrected symbol position information F(n−npre, s) of the TSP #(n−npre) found.

For example, according to the interleaving direction of the de-interleaver 36, in the TSP #(n−npre) for which error correction has been successfully executed before the current TSP #n, symbols in an oblique direction (downward and to the left) from a symbol for which error has been corrected are estimated to have an error. The error detecting unit 38 sets the value of the error position information K(n, s') for the position s' of the symbols that are estimated to have an error to be "2" (step S18).

After completing estimation of the position s' of the symbols having an error, with respect to the range before the current TSP #n, the error detecting unit 38 executes estimation of the position s' of the symbols having an error with respect to the range after the current TSP #n. The same procedure is also taken when the value of npre exceeds that of nseek (step S16: YES).

The error detecting unit 38 determines whether the value of the success-or-failure information E(n+npost) of the TSP #(n+npost) after the current TSP #n is "0" (step S19). If the error detecting unit 38 determines that the value of the success-or-failure information E(n+npost) of the TSP #(n+npost) is not "0" (step S19: NO), the error detecting unit 38 increments the value of npost (step S21) provided that the value of npost does not exceed that of nseek (step S20: NO).

Therefore, for example, when the value of nseek is "3", the error detecting unit 38 searches for the TSP for which error correction has been successfully executed within the range, for example, from the TSP #6 to the TSP #8 relative to the current TSP #5.

The error detecting unit 38 newly determines whether the value of the success-or-failure information E(n+npost) is "0" (step S19). If the error detecting unit 38 determines that the value of the success-or-failure information E(n+npost) is "0" (step S19: YES), this indicates that a TSP has been found for which error correction has been successfully executed in the Reed-Solomon decoding process after the current TSP #n. Therefore, the error detecting unit 38 estimates the position s' of the symbol having an error in the current TSP #n based on the corrected symbol position information F(n+npost, s) of the TSP #(n+npost) found.

For example, according to the interleaving direction of the de-interleaver 36, in the TSP #(n+npost) for which error correction has been successfully executed after the current TSP #n, symbols in an oblique direction (upward and to the right) from a symbol for which error has been corrected are estimated to have an error. The error detecting unit 38 sets the value of the error position information K(n, s') for the position s' of the symbols that are estimated to have an error to be "2" (step S22).

After completing estimation of the position s' of the symbols having an error, with respect to the range after the current TSP #n or when the value of npost exceeds that of nseek (step S20: YES), the error detecting unit 38 outputs the error position information K(n, s) set at steps S13, S18, and S22 (step S23) and causes the series of process steps to come to an end. Steps S19 to S22 may be executed before steps S15 to S18 are executed.

Figure 9:
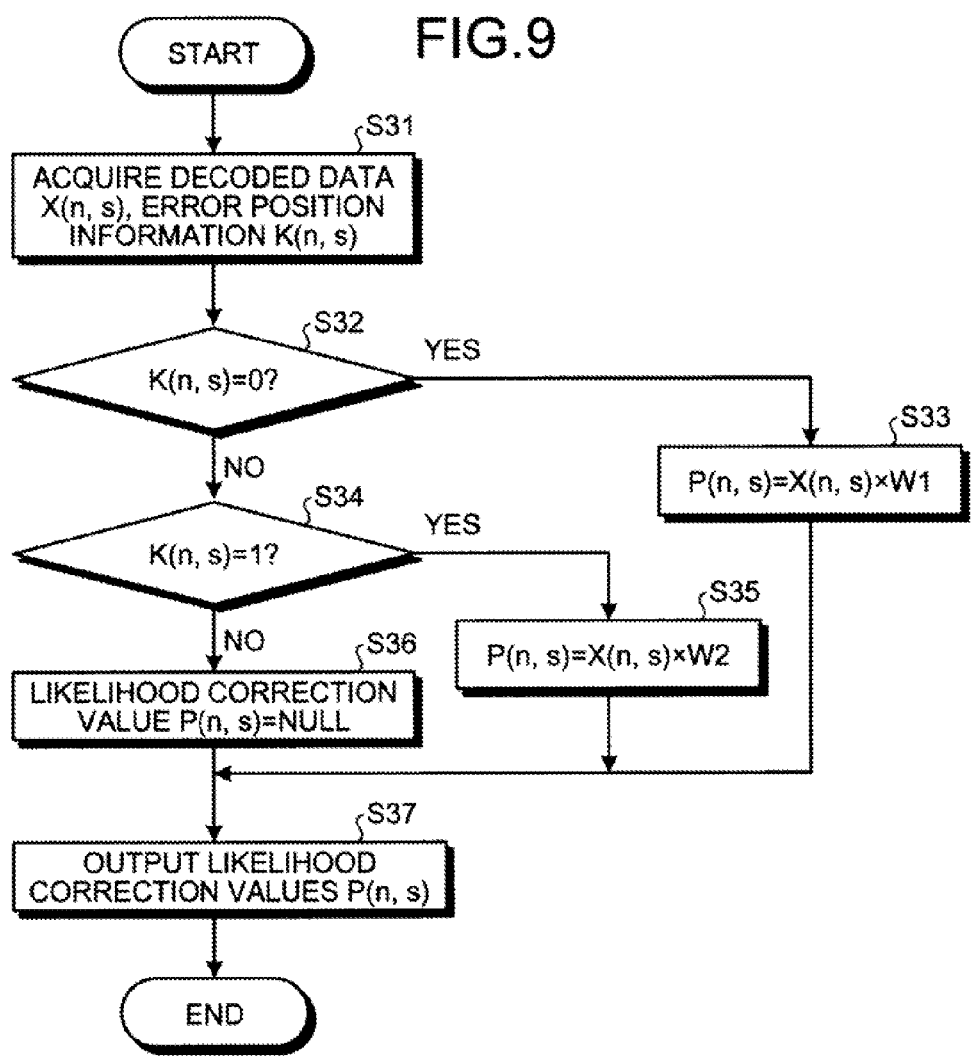
FIG. 9 is a flowchart of the operation of a likelihood correction value calculating unit in the receiving apparatus.

FIG. 9 is a flowchart of the operation of the likelihood correction value calculating unit in the receiving apparatus according to the second embodiment. As depicted in FIG. 9, the likelihood correction value calculating unit 39 acquires the decoded data X(n, s) from the Reed-Solomon decoding processing unit 37 and also acquires the error position information K(n, s) from the error detecting unit 38 (step S31).

If the value of the error position information K(n, s) is "0" (step S32: YES), the likelihood correction value calculating unit 39 may set, for example, a value obtained by multiplying the value of the decoded data X(n, s) by the weighting factor W1 to be the likelihood correction value P(n, s) (step S33). If the value of the error position information K(n, s) is not "0" (step S32: NO) but is "1" (step S34: YES), the likelihood correction value calculating unit 39 may set, for example, a value obtained by multiplying the value of the decoded data X(n, s) by the weighting factor W2 to be the likelihood correction value P(n, s) (step S35). The value of W2 may be set to be smaller than that of W1.

If the value of the error position information K(n, s) is not "0" (step S32: NO) and is also not "1" (step S34: NO), the likelihood correction value calculating unit 39 may set "NULL" to be the likelihood correction value P(n, s) (step S36). The likelihood correction value calculating unit 39 outputs the likelihood correction values P(n, s) set at steps S33, S35, and S36 (step S37) and causes the series of process steps to come to an end. Step S34 may be executed before step S32 is executed.

Simulation results related to reception performance for digital terrestrial broadcasting under integrated services digital broadcasting-terrestrial (ISDB-T) mode 3, i.e., full-segment broadcasting also known as "full-seg", will be described. The typical urban 6-wave model (TU6), which is a typical urban channel model, is used as a propagation path model for the simulation.

FIG. 10 is a chart of an example of the simulation conditions for the receiving apparatus according to the second embodiment. The path profile of the typical urban 6-wave model (TU6) is depicted in FIG. 10.

FIGS. 11 and 12 are graphs depicting characteristics of an example of the simulation results for the receiving apparatus according to the second embodiment. In FIGS. 11 and 12, the axis of ordinate represents the bit error rate (BER) and the axis of abscissa represents the carrier versus noise ratio (CNR). The unit of the CNR is "dB". The curve depicted in the graph of FIG. 11 is obtained when the Doppler frequency fd is set to be 20 Hz and the curve depicted in FIG. 12 is obtained when the Doppler frequency fd is set to be 40 Hz.

For comparison, a comparative example is prepared by obtaining the likelihood correction value using only the TSP for which error correction has been successfully executed in the Reed-Solomon decoding process and feeding this value back to the Viterbi decoding process. From FIGS. 11 and 12, compared to a case where, for example, the BER is 10-4, it can be seen that in the second embodiment, the CNR is improved by about 0.2 dB when the Doppler frequency fd is 20 Hz and by about 0.3 dB when the Doppler frequency fd is 40 Hz.

According to the second embodiment, even when the error correction process combining the Viterbi decoding process and the Reed-Solomon decoding process is executed, advantages identical to those of the first embodiment are achieved. The advantages are acquired not only by the decoding process for the Reed-Solomon code but also by the decoding process for another error correction code such as the Bose-Chaudhuri-Hocquenghem (BCH) code or the Hamming code.

A third embodiment adapts the second embodiment to set the weight of the likelihood correction value based on information concerning a distance such as the Hamming distance or the Euclidean distance used in calculating the likelihood of the state transition in the Viterbi decoding process.

FIG. 13 is a block diagram of signal and data flow in the receiving apparatus according to the third embodiment. As depicted in FIG. 13, in the third embodiment, a second de-interleaver 42 is disposed in the baseband processing unit 32. The second de-interleaver 42 de-interleaves a distance information series output from the Viterbi decoding unit 35 similarly to the de-interleaving by the de-interleaver 36.

The likelihood correction value calculating unit 39 receives distance information λ(n, s) from the second de-interleaver 42 together with the error position information K(n, s) and the decoded data X(n, s). Taking the distance information λ(n, s) into consideration, the likelihood correction value calculating unit 39 sets the likelihood correction value P(n, s) for the symbol estimated to be the correct solution, among the TSP for which error correction has failed in the Reed-Solomon decoding process.

For example, the likelihood correction value P(n, s) of the symbol estimated to be the correct solution in the TSP for which error correction has failed in the Reed-Solomon decoding process, i.e., the symbol whose value of K(n, s) is "1" may be set by calculating Eq. (4) below. "W2(λ(n, s))" is a weighting function whose argument is a distance such as the Hamming distance or the Euclidean distance. The value of W2(λ) may be set to be smaller than that of W1 taking into consideration the possibility that the error detecting unit 38 estimates a symbol actually having an error to be the correct solution.

$$P(n,s)=X(n,s) \times W2(\lambda(n,s))(\text{when, } K(n,s)=1) \qquad (4)$$

For example, the likelihood correction value P(n, s) for the symbol of the TSP for which error correction has been successfully executed in the Reed-Solomon decoding process, i.e., the symbol whose value of K(n, s) is "0" may be set by calculating Eq. (1). For example, the likelihood correction value P(n, s) for the symbol that is estimated to have an error in the TSP for which error correction has failed in the Reed-Solomon decoding process, i.e., the symbol whose value of K(n, s) is "2" may be set according to Eq. (3).

Figure 14:
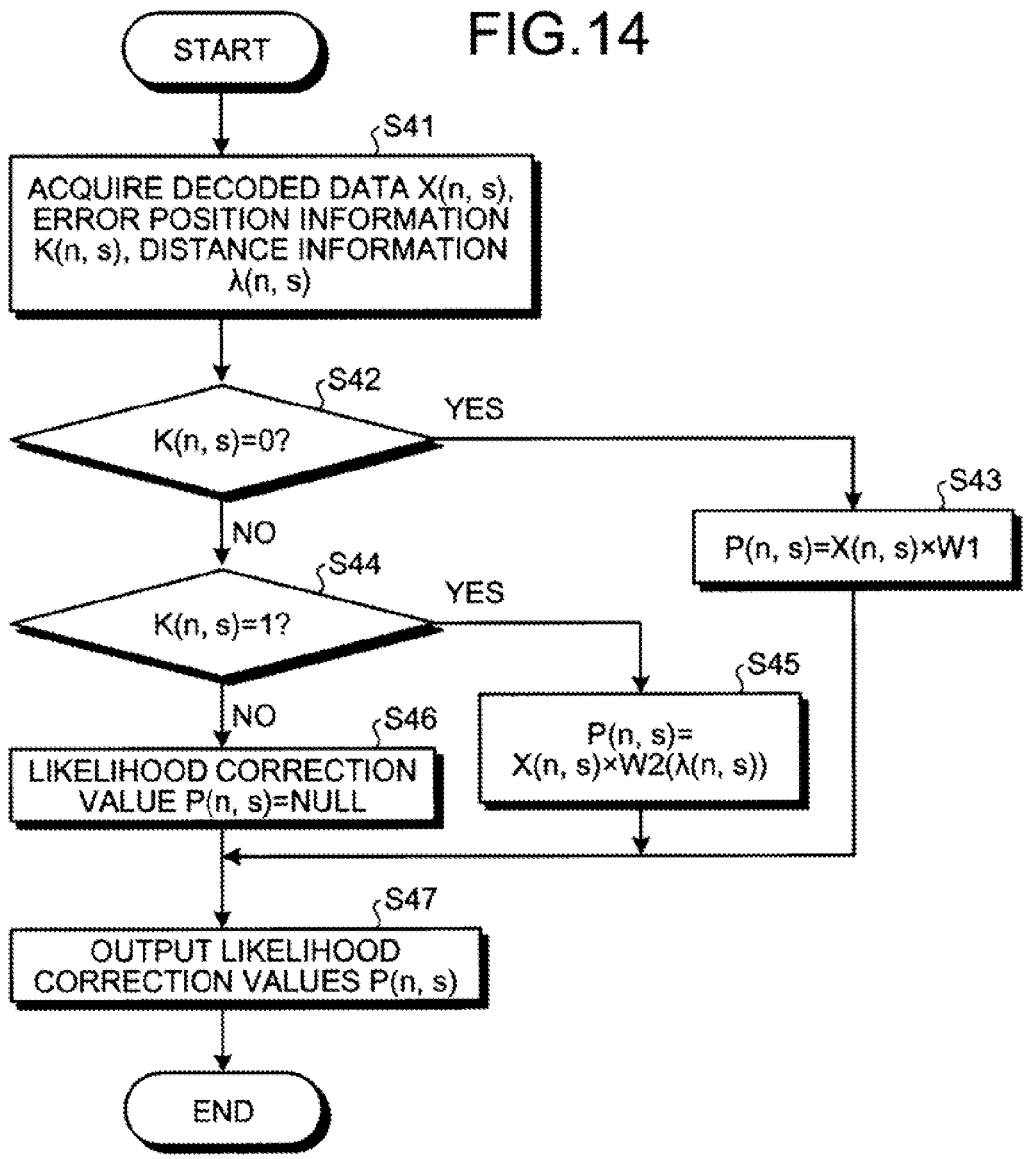
FIG. 14 is a flowchart of the operation of the likelihood correction value calculating unit in the receiving apparatus according to the third embodiment.

FIG. 14 is a flowchart of the operation of the likelihood correction value calculating unit in the receiving apparatus according to the third embodiment. As depicted in FIG. 14, the likelihood correction value calculating unit 39 acquires the decoded data X(n, s) and the error position information K(n, s) and also acquires the distance information λ(n, s) from the second de-interleaver 42 (step S41).

If the value of the error position information K(n, s) is "0" (step S42: YES), for example, the likelihood correction value calculating unit 39 may set a value obtained by multiplying the value of the decoded data X(n, s) by the weighting factor W1 to be the likelihood correction value P(n, s) (step S43). If the value of the error position information K(n, s) is not "0" (step S42: NO) but is "1" (step S44: YES), for example, the likelihood correction value calculating unit 39 may set a value obtained by multiplying the value of the decoded data X(n, s) by the value of the weighting function W2(λ(n, s)) to be the likelihood correction value P(n, s) (step S45). The value of W2(λ(n, s)) may be set to be smaller than that of W1.

If the value of the error position information K(n, s) is not "0" (step S42: NO) and is also not "1" (step S44: NO), the likelihood correction value calculating unit 39 may set NULL to be the likelihood correction value P(n, s) (step S46). The likelihood correction value calculating unit 39 outputs the likelihood correction values P(n, s) set at steps S43, S45, and S46 (step S47) and causes the series of process steps to come to an end. Step S44 may be executed before step S42 is executed.

In the third embodiment, the weight of the likelihood correction value is set based on the information concerning a distance such as the Hamming distance or the Euclidean distance used in calculating the likelihood of the state transition in the Viterbi decoding process. Thus, in addition to achieving the advantages of the second embodiment, the third embodiment enables reduction of the possibility that a symbol actually having an error will be estimated to be the correct solution.

A fourth embodiment adapts the second embodiment to cause the likelihood correction value calculating unit 39 to acquire the likelihood correction value P(n, s) after causing the interleaver 40 to execute the interleaving process for each of the position information K(n, s) and the decoded data X(n, s).

Figure 15:
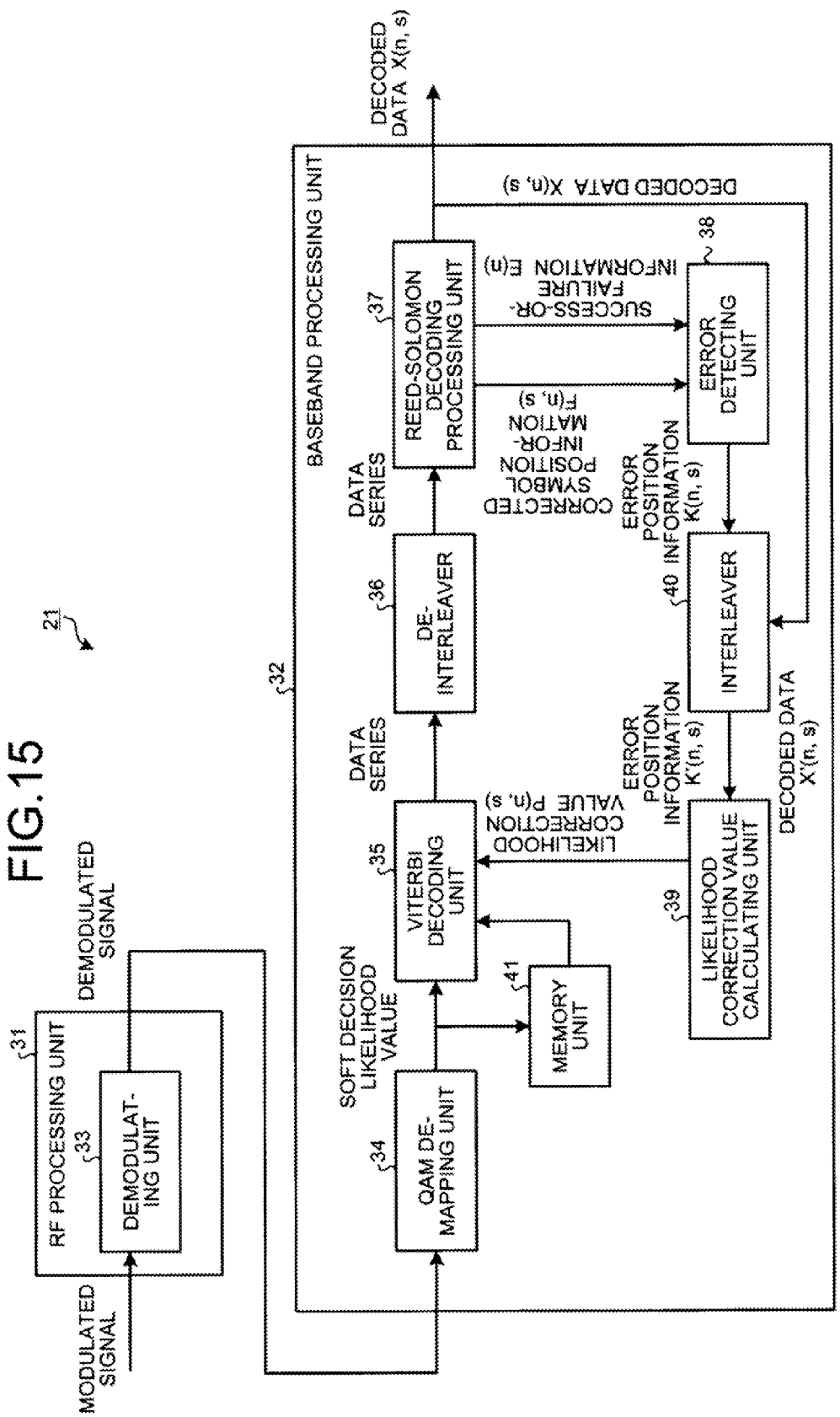
FIG. 15 is a block diagram of signal and data flow in the receiving apparatus according to a fourth embodiment.

FIG. 15 is a block diagram of signal and data flow in the receiving apparatus according to the fourth embodiment. As depicted in FIG. 15, the interleaver 40 interleaves the order of the error position information K(n, s) output from the error detecting unit 38 and the decoded data X(n, s) output from the Reed-Solomon decoding processing unit 37 such that the order is same as that of the soft decision likelihood value series to be input into the Viterbi decoding unit 35.

The likelihood correction value calculating unit 39 sets the likelihood correction value P(n, s) based on error position information K'(n, s) whose order has been interleaved by the interleaver 40 and decoded data X'(n, s) whose order has been interleaved by the interleaver 40. The likelihood correction value P(n, s) set by the likelihood correction value calculating unit 30 is fed back to the Viterbi decoding unit 35 and is used in the second and subsequent iterative Viterbi decoding processes executed by the Viterbi decoding unit 35.

According to the fourth embodiment, even when the error correction process combining the Viterbi decoding process and the Reed-Solomon decoding process is executed, the same advantages as those of the first embodiment are achieved.

In the third embodiment, the likelihood correction value calculating unit 39 may acquire the likelihood correction value P(n, s) after the interleaver 40 executes the interleaving process as in the fourth embodiment. In the second and the third embodiments, the interleaver 40 may execute the interleaving process and thereafter, the error detecting unit 38 may detect the position of the symbol that is estimated to have an error, and the likelihood correction value calculating unit 39 may acquire the likelihood correction value P(n, s).

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus comprising:
a generating unit that generates a soft decision likelihood value based on an input signal;
a decoding unit that with respect to the soft decision likelihood value, executes a decoding process supporting a convolutional code;
a first interleaving unit that interleaves the order of a data series acquired by the decoding process such that errors occurring in burst in the data series are converted into random errors;
a correcting unit that generates decoded data corresponding to the input signal by executing an error correcting process on the data series that has been interleaved by the first interleaving unit;
a detecting unit that based on position information of a symbol for which error has been corrected successfully by the error correcting process, estimates whether an error occurs with respect to a symbol for which error cannot be corrected due to a failure of the error correcting process and detects a position of the symbol that is estimated to have an error;
a calculating unit that based on the decoded data and information concerning the position of the symbol estimated to have an error, calculates a correction value of the soft decision likelihood value; and
a second interleaving unit that interleaves the order of a correction value series of the soft decision likelihood value into an order that is a reverse of the order resulting from interleaving by the first interleaving unit, wherein
the correction value series of the soft decision likelihood value resulting from interleaving by the second interleaving unit is fed back to the decoding unit.

2. The electronic apparatus according to claim 1, wherein the calculating unit calculates the correction value of the soft decision likelihood value for a given symbol based on whether error correction process for the given symbol has been successfully executed.

3. The electronic apparatus according to claim 1, wherein the calculating unit calculates for a symbol estimated to have no error among symbols for which the error correction process has failed, a correction value of the soft decision likelihood value, based on a Euclidean distance or a Hamming distance used in a state transition series of the decoding unit.

4. The electronic apparatus according to claim 1, wherein the detecting unit estimates as a symbol having an error, symbols arranged in the order resulting from interleaving by the first interleaving unit and symbols at positions of symbols for which error is corrected by the error correction process successfully.

5. A receiving apparatus comprising:
a demodulating unit that demodulates a received signal;
a generating unit that generates a soft decision likelihood value, based on the demodulated signal;
a decoding unit that with respect to the soft decision likelihood value, executes a decoding process supporting a convolutional code;
a first interleaving unit that interleaves the order of a data series acquired by the decoding process such that errors occurring in burst in the data series are converted into random errors;
a correcting unit that generates decoded data corresponding to the demodulated signal by executing an error correcting process on the data series that has been interleaved by the first interleaving unit;
a detecting unit that based on position information of a symbol for which error has been corrected successfully by the error correcting process, estimates whether an error occurs with respect to a symbol for which error cannot be corrected due to a failure of the error correcting process and detects a position of the symbol that is estimated to have an error;
a calculating unit that based on the decoded data and information concerning the position of the symbol estimated to have an error, calculates a correction value of the soft decision likelihood value; and
a second interleaving unit that interleaves the order of a correction value series of the soft decision likelihood value into an order that is a reverse of the order resulting from interleaving by the first interleaving unit, wherein
the correction value series of the soft decision likelihood value resulting from interleaving by the second interleaving unit is fed back to the decoding unit.

6. The receiving apparatus according to claim 5, wherein the calculating unit calculates the correction value of the soft decision likelihood value for a given symbol based on whether error correction process for the given symbol has been successfully executed.

7. The receiving apparatus according to claim 5, wherein the calculating unit calculates for a symbol estimated to have no error among symbols for which the error correction process has failed, a correction value of the soft decision likelihood value, based on a Euclidean distance or a Hamming distance used in a state transition series of the decoding unit.

8. The receiving apparatus according to claim 5, wherein the detecting unit estimates as a symbol having an error, symbols arranged in the order resulting from interleaving by the first interleaving unit and symbols at positions of symbols for which error is corrected by the error correction process successfully.

9. An electronic method comprising:
generating a soft decision likelihood value based on an input signal;
executing with respect to the soft decision likelihood value, a decoding process supporting a convolutional code;
interleaving the order of a data series acquired by the decoding process such that errors occurring in burst in the data series are converted into random errors;
generating decoded data corresponding to the input signal by executing an error correcting process on the data series that has been interleaved;
estimating, based on position information of a symbol for which error has been corrected successfully by the error correcting process, whether an error occurs with respect to a symbol for which error cannot be corrected due to a failure of the error correcting process;
detecting a position of the symbol that is estimated to have an error;
calculating based on the decoded data and information concerning the position of the symbol estimated to have an error, a correction value of the soft decision likelihood value; and
interleaving the order of a correction value series of the soft decision likelihood value into an order that is a reverse of the order resulting from interleaving at the interleaving of the order of the data series, wherein
the correction value series of the soft decision likelihood value resulting from interleaving at the interleaving of the order of the correction value series of the soft decision likelihood value is fed back to the decoding.

10. The electronic apparatus according to claim 9, wherein the calculating includes calculating the correction value of the soft decision likelihood value for a given symbol based on whether error correction process for the given symbol has been successfully executed.

11. The electronic apparatus according to claim 9, wherein the calculating includes calculating for a symbol estimated to have no error among symbols for which the error correction process has failed, a correction value of the soft decision likelihood value, based on a Euclidean distance or a Hamming distance used in a state transition series of the decoding unit.

12. The electronic apparatus according to claim 9, wherein the estimating includes estimating as a symbol having an error, symbols arranged in the order resulting from the interleaving at the interleaving of the order of the data series and symbols at positions of symbols for which error is corrected by the error correction process successfully.

* * * * *